United States Patent
Steidl

(10) Patent No.: US 11,672,107 B2
(45) Date of Patent: Jun. 6, 2023

(54) CONTROL CABINET AND ASSOCIATED INSERTABLE CONTROL DEVICE

(71) Applicant: KUKA Deutschland GmbH, Augsburg (DE)

(72) Inventor: Dietmar Steidl, Augsburg (DE)

(73) Assignee: KUKA Deutschland GmbH, Augsburg (DE)

( * ) Notice: Subject to any disclaimer, the term of this patent is extended or adjusted under 35 U.S.C. 154(b) by 45 days.

(21) Appl. No.: 17/623,651

(22) PCT Filed: Jun. 23, 2020

(86) PCT No.: PCT/EP2020/067441
§ 371 (c)(1),
(2) Date: Dec. 29, 2021

(87) PCT Pub. No.: WO2021/004775
PCT Pub. Date: Jan. 14, 2021

(65) Prior Publication Data
US 2022/0264773 A1    Aug. 18, 2022

(30) Foreign Application Priority Data
Jul. 8, 2019    (DE) .................... 20 2019 103 733.4

(51) Int. Cl.
H05K 7/20      (2006.01)
H05K 7/14      (2006.01)

(52) U.S. Cl.
CPC ..... H05K 7/20918 (2013.01); H05K 7/20145 (2013.01); H05K 7/20572 (2013.01); H05K 7/1411 (2013.01); H05K 7/14325 (2022.08)

(58) Field of Classification Search
CPC .......... H05K 7/20136–20145; H05K 7/20172; H05K 7/20554; H05K 7/20572;
(Continued)

(56) References Cited

U.S. PATENT DOCUMENTS 6,123,266 A * 9/2000 Bainbridge ....... H01M 10/6566
                                                          62/259.3
6,463,997 B1 * 10/2002 Nicolai ............. H05K 7/20572
                                                          165/80.2
(Continued)

FOREIGN PATENT DOCUMENTS

DE          3316978 A1    11/1984
DE     102011005838 A1     9/2012
(Continued)

OTHER PUBLICATIONS

European Patent Office; Translated Written Opinion in related International Patent Application No. PCT/EP2020/067441 dated Sep. 2020. (Year: 2020).*

(Continued)

Primary Examiner — Zachary Pape
(74) Attorney, Agent, or Firm — Dorton & Willis, LLP

(57) ABSTRACT

A control cabinet for at least one electrical drive controller includes a control cabinet housing a first cabinet compartment formed in the control cabinet housing and having at least one inlet opening for fresh air, at least one first transfer opening and a fresh air duct flow-connecting the inlet opening to the first transfer opening. A second cabinet compartment is formed in the control cabinet housing and has at least one outlet opening for exhaust air, at least one second transfer opening, and an exhaust air duct flow-connecting the outlet opening to the second transfer opening. A third cabinet compartment is formed in the control cabinet housing and is sealed off in terms of flow from the first cabinet compartment, the second cabinet compartment, and the environment outside the control cabinet. A partition delimits the third cabinet compartment in terms of flow from the first cabinet compartment and the second cabinet compartment, and has the at least one first transfer opening and the at least one second transfer opening. The third cabinet (Continued)

compartment is in the form of a rack with at least one drawer, wherein each drawer is designed to receive an insertable control device.

12 Claims, 5 Drawing Sheets

(58) Field of Classification Search
CPC .......... H05K 7/20918; H05K 7/14325; H02B 1/56–565; G06F 1/20
See application file for complete search history.

(56) References Cited

U.S. PATENT DOCUMENTS

| | | | |
|---|---|---|---|
| 7,061,759 B2 * | 6/2006 | Karppinen | H05K 7/20572 165/122 |
| 7,112,131 B2 * | 9/2006 | Rasmussen | H05K 7/20572 361/691 |
| 10,448,544 B1 * | 10/2019 | Kleinecke | H05K 7/16 |
| 2020/0039095 A1 | 2/2020 | Wagner et al. | |

FOREIGN PATENT DOCUMENTS

| | | |
|---|---|---|
| EP | 2 797 396 A2 | 10/2014 |
| WO | 2018/138041 A1 | 8/2018 |

OTHER PUBLICATIONS

European Patent Office; Search Report in related International Patent Application No. PCT/EP2020/067441 dated Sep. 4, 2020; 2 pages.

* cited by examiner

CONTROL CABINET AND ASSOCIATED INSERTABLE CONTROL DEVICE

CROSS-REFERENCE TO RELATED APPLICATIONS

This application is a national phase application under 35 U.S.C. § 371 of International Patent Application No. PCT/EP2020/067441, filed Jun. 23, 2020 (pending), which claims the benefit of priority to German Patent Application No. DE 20 2019 103 733.4, filed Jul. 8, 2019, the disclosures of which are incorporated by reference herein in their entirety.

TECHNICAL FIELD

The invention relates to a control cabinet for at least one electrical drive control. The invention also relates to an associated insertable control device.

BACKGROUND

From EP 2 797 396 A2, a control cabinet, in particular for an industrial robot, is known, having a housing, at least one electrical and/or electronic component arranged within the housing, and an electromechanical energy store that has an electric motor and a rotatably mounted flywheel that can, by means of the electric motor, be set in rotation and is configured to generate an air flow for cooling the at least one electrical and/or electronic component.

From WO 2018/138041 A1, a cooling device for cooling electrical components of a robot control device by means of a cooling air flow generated by a fan is known, which cooling device has a first receiving space for first electrical components, a second receiving space for second electrical components and a cooling body wall separating the first receiving space from the second receiving space in terms of flow, which cooling body wall has a first partition surface facing the first receiving space and an opposite second partition surface facing an intermediate space of the cooling body wall, which second partition surface is provided with cooling wall projections forming at least one flow channel, and which cooling body wall has a cooling air passage opening that is designed to convey a cooling air flow conveyed by at least one fan of the cooling device from the first receiving space through the cooling body wall into the intermediate space.

SUMMARY

The object of the invention is to create a control cabinet that has an improved cooling effect for insertable control devices inserted into the control cabinet. Another object is to create an insertable control device having a reliable cooling effect, which can be inserted quickly and easily into such control cabinets.

According to the invention, this object is achieved by a control cabinet for at least one electrical drive control, having:
 a control cabinet housing,
 a second cabinet compartment that is formed in the control cabinet housing and has at least one inlet opening for fresh air, at least one first transfer opening, and a fresh air duct flow-connecting the at least one inlet opening to the at least one first transfer opening,
 a second cabinet compartment that is formed in the control cabinet housing and has at least one outlet opening for exhaust air, at least one second transfer opening, and an exhaust air duct flow-connecting the at least one outlet opening to the at least one second transfer opening, and
 a third cabinet compartment that is formed in the control cabinet housing and sealed off in terms of flow from the first cabinet compartment, the second cabinet compartment and the environment outside the control cabinet, wherein
 the control cabinet housing has a partition that delimits the third cabinet compartment in terms of flow from the first cabinet compartment and the second cabinet compartment and has the at least one first transfer opening and the at least one second transfer opening, and the third cabinet compartment is in the form of a rack with at least one drawer, wherein each drawer is designed to receive an insertable control device.

In drive technology, and especially in robotics, frequency converters are used to operate motors, e.g. permanently excited synchronous machines. To achieve a suitable degree of protection (IP), frequency converters are usually installed in a control cabinet together with the controller. In the case of larger manipulators or industrial robots, greater thermal losses occur in the frequency converters, which must be led out of the control cabinet in a suitable manner.

Because heat exchangers would be quite large in the case of the heat to be dissipated and could also lead to a higher temperature in the frequency converter, frequency converters are usually installed in control cabinets using a "push-through technology". In this case, however, the control cabinet requires a rear wall with openings cut out to fit. The frequency converters, together with their heat sinks, then hang through said openings in an outside cooling air duct in order to conduct the heat directly to the outside.

Although this arrangement is technically simple to implement, it has a plurality of disadvantages. Because the heat sinks require a large area for higher motor currents and/or power, the frequency converters must generally be screwed upright on the rear wall. Due to the high weight and the installation far back in the cabinet, replacement is difficult from an ergonomic point of view. The cooling air is normally blown from the bottom up through the heat sink due to natural convection. Frequency converters that are installed further up in the cabinet therefore receive preheated air from frequency converters further down and can no longer be cooled properly. In the case of multi-robot control cabinets, vertical installation quickly leads to very tall and less deep cabinets. This significantly increases the risk of the control cabinet tipping over.

With the invention, the following improvements can optionally be achieved, individually or in combination:

A simple, quick and ergonomically exchangeable controller (insertable control device) to keep set-up times short. A compact and space-saving structure and a scalable system can be achieved. Significantly simplified installation can be realized.

A rack-based cabinet that has a number of insertion compartments can be used to achieve the object. For example, a control module (i.e. insertable control device) having an integrated frequency converter can be simply and ergonomically inserted horizontally into each of the insertion compartments and fixed in place mechanically. The control module has an internal heat sink, optionally above, in the middle or below, having a controlled fan and is mechanically pressed against suitable sealing lips in the side wall of the cabinet, wherein the air inlet of the module sucks in cold air from the fresh air duct through an opening, presses it through the U-shaped heat sink and finally blows it out hot into the exhaust air duct through a second opening.

Because the air is routed through the module, the sealing limit for the IP protection class is no longer flat on the cabinet wall, but extends through the module, meaning that the heat sink in the module is sealed from the rest of the module and meets the corresponding IP protection class.

The module can be mechanically locked using a tool-free quick-release fastener, which not only provides a tight connection to the fresh and exhaust air ducts, but also the electrical contacting of the module for supplying power, as well as other connections such as ballast resistors.

This efficient arrangement not only makes replacing the controller very easy, quick and ergonomically pleasant, but very compact a plurality of controller plug-in units can also be built, a plurality of which can be arranged one above the other in a scalable rack-based cabinet. Thanks to the clever air routing with two independent vertical air ducts in the side wall, the controllers installed further above also receive cool fresh air and are not additionally heated by the lower controllers. This means that the individual racks are almost thermally independent of one another.

In addition to the robot controllers, the compartments can also be used for other insertable units, for example in the form of additional axis modules (i.e. frequency converters without a controller), insertable frames for peripherals and customer installations or cooling devices for the cabinet interior. The cooling device cools the air in the cabinet interior and releases the waste heat to the air duct on the side, in a manner comparable to the robot controllers.

Customers can also purchase control modules without a cabinet and install them in their own customized cabinets. Modules from the solution presented here can be used and integrated very flexibly into existing customer cabinet concepts via fresh and exhaust air pipes.

In the surface region of the adjoining first cabinet compartment, the partition can have at least one separate first transfer opening at the height of a drawer, which transfer opening has a first sealing flange on its side facing the respective drawer, which sealing flange is designed to make airtight contact with a corresponding first sealing counter-flange of a suction opening on the insertable control device in an arrangement of an insertable control device inserted and locked in the respective drawer.

In the surface region of the adjoining second cabinet compartment, the partition can have at least one separate second transfer opening at the height of a drawer, which transfer opening has a second sealing flange on its side facing the respective drawer, which sealing flange is designed to make airtight contact with a corresponding second sealing counter-flange of an exhaust opening on the insertable control device in an arrangement of an insertable control device inserted and locked in the respective drawer.

The first sealing flange, the first sealing counter-flange, the second sealing flange and/or the second sealing counter-flange can each have at least one sealing lip.

At least one braking resistor can be arranged within the second cabinet compartment. The one braking resistor or the plurality of braking resistors can be used to convert electrical energy recovered due to the generator operation of the electrical motors into heat by delaying the movement controlled by the insertable control devices, for example of a robotic arm.

A cable duct can be formed on a side of the partition opposite the third cabinet compartment between the first cabinet compartment and the second cabinet compartment, wherein the partition has electrical connection means in the surface region of said cable duct, which electrical connection means are arranged on the plug-in side facing in the direction of the third cabinet compartment such that corresponding electrical counterpart connection means of an insertable control device inserted and locked in the third cabinet compartment make contact with the electrical connection means.

Each drawer of the third cabinet compartment can have sliding guides that are designed to displaceably mount an insertable control device inserted into the respective drawer between a locked position in which the insertable control device is connected mechanically, electrically and in terms of cooling air flow to the control cabinet, and an unlocked position in which the insertable control device is disconnected mechanically, electrically and in terms of cooling air flow from the control cabinet and can be pulled out of the control cabinet manually.

Each drawer of the third cabinet compartment can have a manually adjustable locking lever that is designed to optionally move an insertable control device mounted in the respective drawer either from the unlocked position into the locked position and/or from the locked position into the unlocked position.

The object is also achieved according to the invention by an insertable control device that is designed for inserting the insertable control device into a drawer of the third cabinet compartment of a control cabinet according to one or more of the embodiments described, wherein the insertable control device is an electrical drive controller of a robot, an additional axis drive device, a refrigeration device or a peripheral insertable frame for additional devices.

The insertable control device can have a latching means that is designed to transfer a movement of the locking lever to a pushing movement of the insertable control device within the drawer in cooperation with a locking lever of the control cabinet such that by moving the locking lever over the latching means of the insertable control device, the insertable control device mounted in the respective drawer is optionally moved from the unlocked position into the locked position and/or from the locked position into the unlocked position.

Specific embodiments of the invention are explained in more detail in the following descriptions with reference to the accompanying figures. Specific features of these embodiments, possibly considered individually or in further combinations, can represent general features of the invention regardless of the specific context in which they are mentioned.

BRIEF DESCRIPTION OF THE DRAWINGS

The accompanying drawings, which are incorporated in and constitute a part of this specification, illustrate exemplary embodiments of the invention and, together with a general description of the invention given above, and the detailed description given below, serve to explain the principles of the invention.

DETAILED DESCRIPTION

Figure 1:
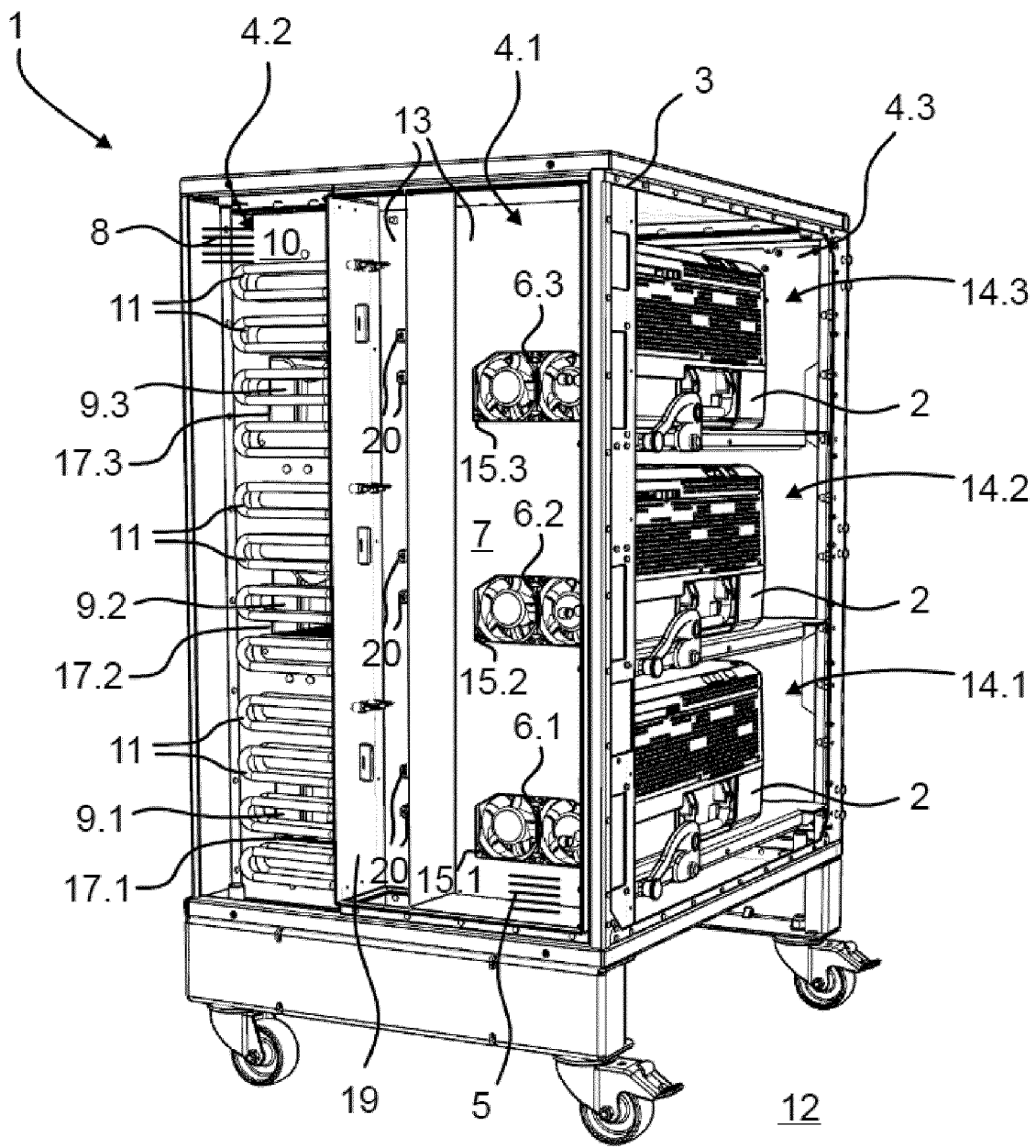
FIG. 1 is a perspective view of an exemplary first embodiment of a control cabinet according to the invention having inserted insertable control devices.
Figure 2:
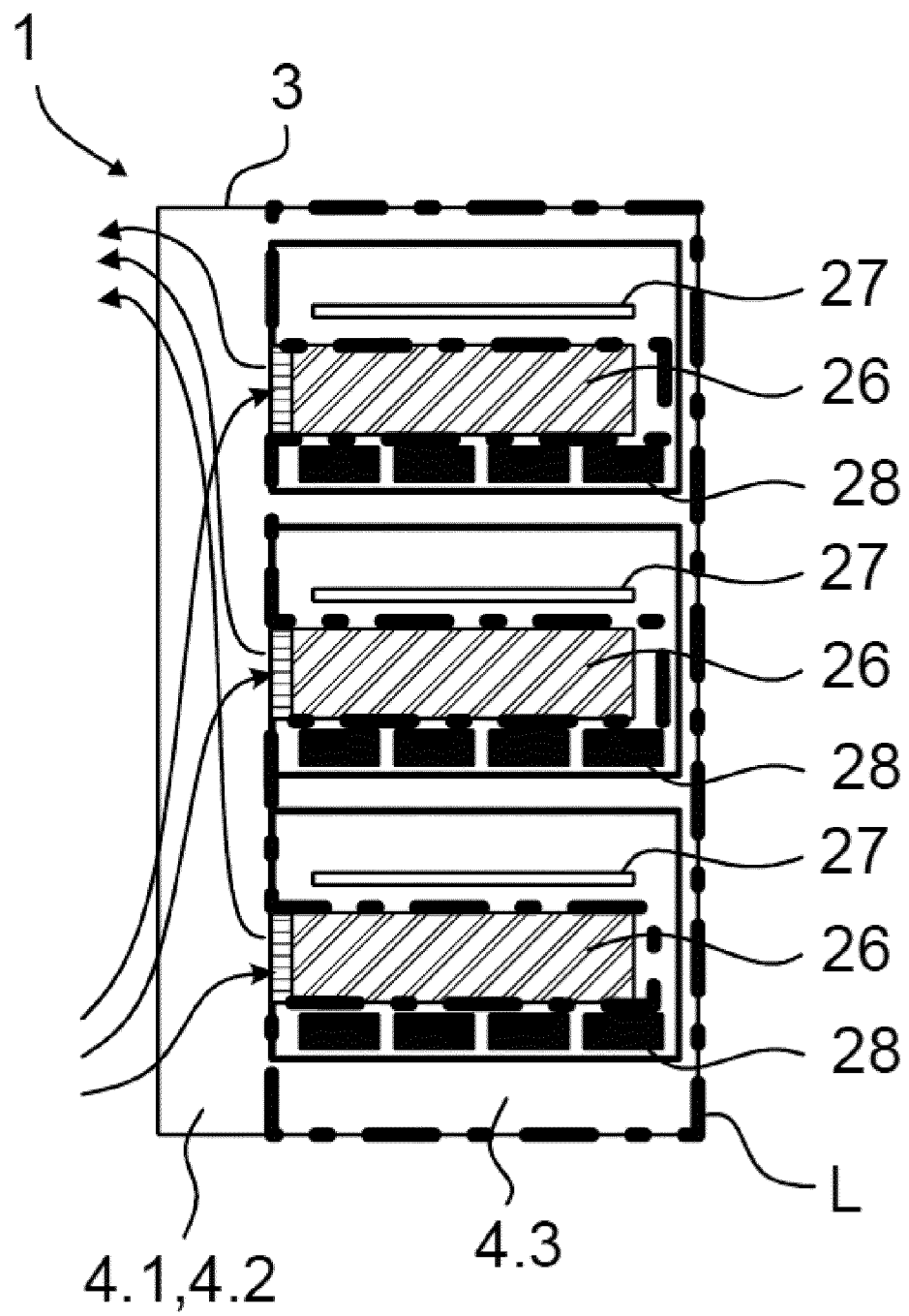
FIG. 2 is a schematic sectional view through the control cabinet according to FIG. 1 and the insertable control devices according to FIG. 1.

An exemplary first embodiment of a control cabinet 1 is shown in FIGS. 1 and 2. The control cabinet 1 is designed to receive at least one electrical drive control 2, as is shown in isolation in FIG. 5, for example.

The control cabinet 1 has a control cabinet housing 3.

A first cabinet compartment 4.1 is formed in the control cabinet housing 3 and has at least one inlet opening 5 for fresh air, at least one (in the case of the present embodiment exactly three) first transfer opening 6.1, 6.2, 6.3, and a fresh air duct 7 flow-connecting the at least one inlet opening 5 to the at least one first transfer opening 6.1, 6.2, 6.3. The inlet opening 5 is integrated in a cover panel closing the first cabinet compartment 4.1, which cover panel is removed in FIG. 1 for the sake of clarity, but the position of the inlet opening 5 is indicated schematically by horizontal lines, although the cover panel is not shown.

A second cabinet compartment 4.2 is also formed in the control cabinet housing 3 and has at least one outlet opening 8 for exhaust air, at least one (in the case of the present embodiment exactly three) second transfer opening 9.1, 9.2, 9.3, and an exhaust air duct 10 flow-connecting the at least one outlet opening 8 to the at least one second transfer opening 9.1, 9.2, 9.3. The outlet opening 8 is integrated in a cover panel closing the second cabinet compartment 4.2, which cover panel is removed in FIG. 1 for the sake of clarity, but the position of the outlet opening 8 is indicated schematically by horizontal lines, although the cover panel is not shown.

In the case of the present embodiment, a plurality of braking resistors 11 are arranged within the second cabinet compartment 4.2.

A third cabinet compartment 4.3 is also formed in the control cabinet housing 3 and is sealed off in terms of flow from the first cabinet compartment 4.1, the second cabinet compartment 4.2 and the environment 12 outside the control cabinet 1.

The control cabinet housing 3 also has a partition 13 that delimits the third cabinet compartment 4.3 in terms of flow from the first cabinet compartment 4.1 and the second cabinet section 4.2 and has the first transfer openings 6.1, 6.2, 6.3 and the second transfer openings 9.1, 9.2, 9.3, wherein the third cabinet compartment 4.3 is in the form of a rack with at least one drawer 14.1, 14.2, in the case of the present embodiment with exactly three drawers 14.1, 14.2, 14.3, wherein each drawer 14.1, 14.2, 14.3 is designed to receive an insertable control device 2.

Figure 3:
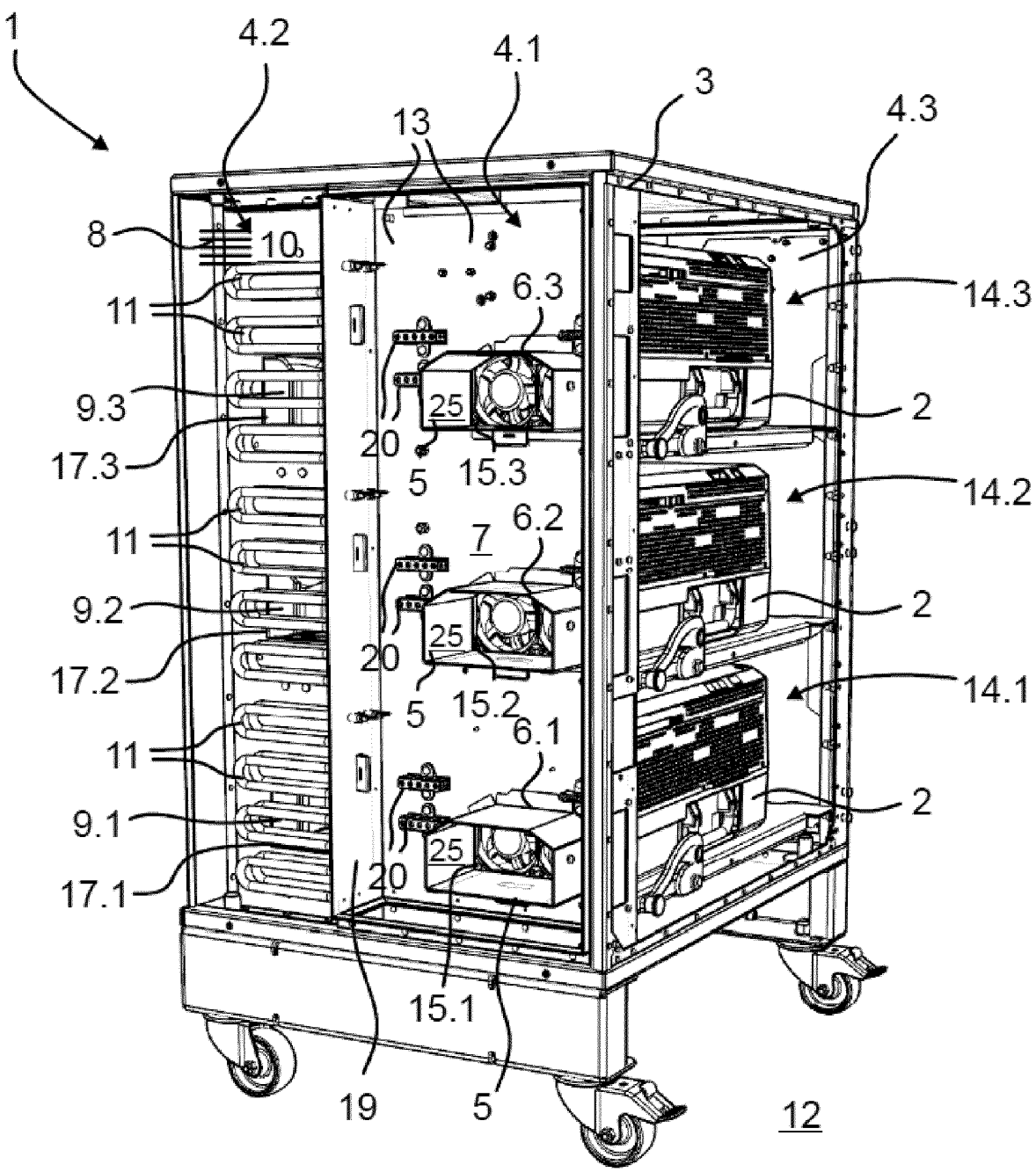
FIG. 3 is a perspective view of a modified second embodiment of a control cabinet according to the invention having inserted insertable control devices.
Figure 4:
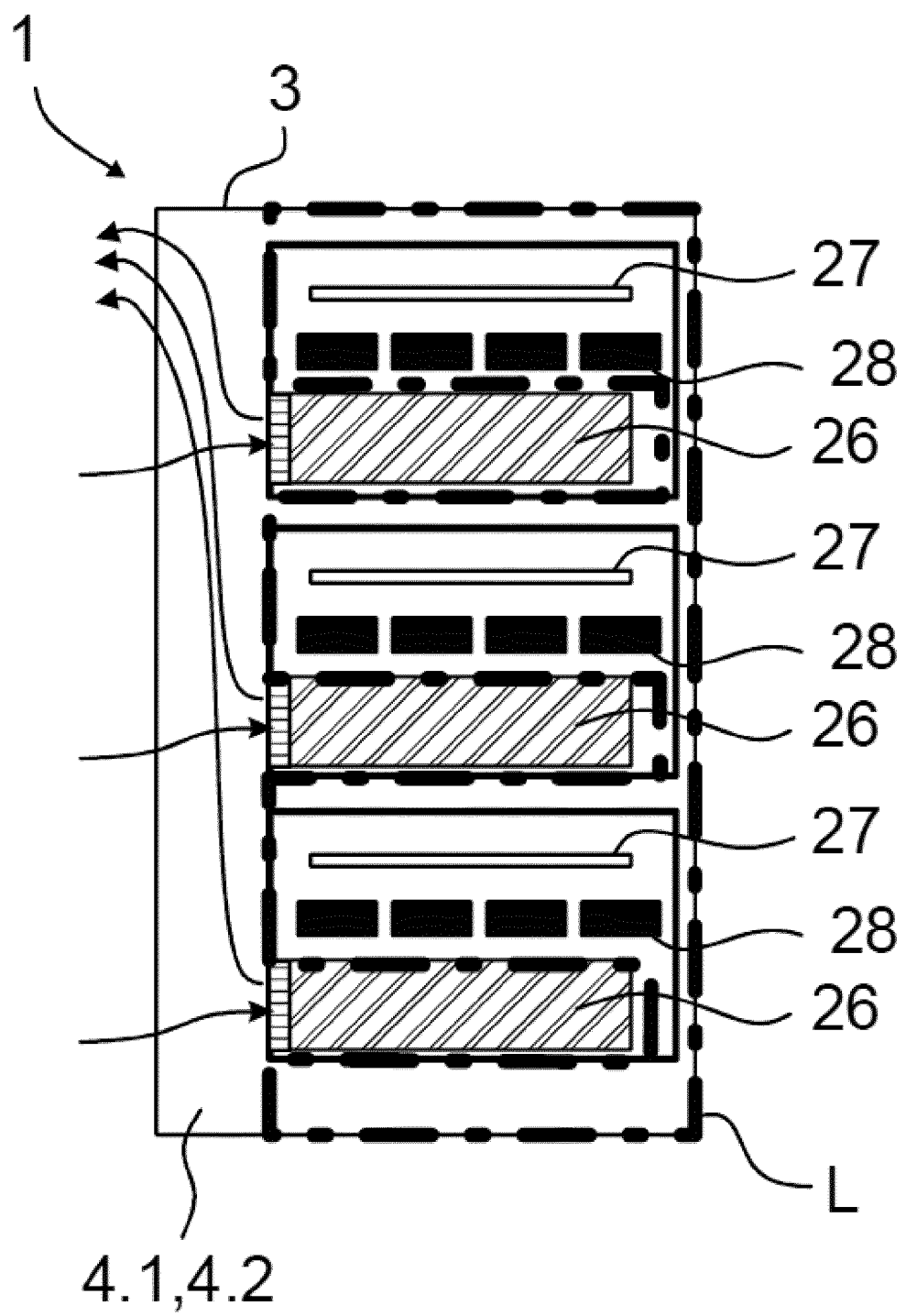
FIG. 4 is a schematic sectional view through the control cabinet according to FIG. 3 and the insertable control devices according to FIG. 3.

Both in the first embodiment according to FIGS. 1 and 2 and in the second embodiment according to FIGS. 3 and 4, the partition 13 has a separate first transfer opening 6.1, 6.2, 6.3, in each case at the height of a drawer 14.1, 14.2, 14.3, in the surface region of the adjoining first cabinet compartment 4.1, which transfer opening has a first sealing flange 15.1, 15.2, 15.3 on its side facing the respective drawer 14.1, 14.2, 14.3, which sealing flange is designed to make airtight contact with a corresponding first sealing counter-flange 16.1, 16.2, 16.3 of a suction opening on the insertable control device 2 in an arrangement of an insertable control device 2 inserted and locked in the respective drawer 14.1, 14.2, 14.3.

The second embodiment according to FIGS. 3 and 4 differs from the first embodiment according to FIGS. 1 and 2, inter alia, in that, instead of a single inlet opening 5 (FIG. 1) according to the first embodiment, which lets the fresh air into the fresh air duct 7 so that the fresh air is distributed to the three first transfer openings 6.1, 6.2, 6.3 in the manner of a chimney, in the second embodiment each of the three transfer openings 6.1, 6.2, 6.3 is assigned its own separate inlet opening 5 (FIG. 3). Such an assignment is created by a respective duct connector 25 that connects the respective transfer opening 6.1, 6.2, 6.3 to its own separate inlet opening 5 (FIG. 3).

In an analogous manner to the first transfer opening 6.1, 6.2, 6.3 of the first cabinet compartment 4.1, the partition 13 has a separate second transfer opening 9.1, 9.2, 9.3, in each case at the height of a drawer 14.1, 14.2, 14.3, in the surface region of the adjoining second cabinet compartment 4.2, which transfer opening has a second sealing flange 17.1, 17.2, 17.3 on its side facing the respective drawer 14.1, 14.2, 14.3, which sealing flange is designed to make airtight contact with a corresponding second sealing counter-flange of an exhaust opening on the insertable control device 2 in an arrangement of an insertable control device 2 inserted and locked in the respective drawer 14.1, 14.2, 14.3.

In each case in the illustrated embodiments, a cable duct 19 is formed on a side of the partition 13 opposite the third cabinet compartment 4.3 between the first cabinet compartment 4.1 and the second cabinet compartment 4.2, wherein the partition 13 has electrical connection means 20 in the surface region of said cable duct 19, which electrical connection means are arranged on the plug-in side facing in the direction of the third cabinet compartment 4.3 such that corresponding electrical counterpart connection means of an insertable control device 2 inserted and locked in the third cabinet compartment 4.3 can make contact with the electrical connection means 20. The cable duct 19 is sealed off from the outside air, in particular at the connection between the duct connector 25 and the side wall (not visible). The embodiment according to FIG. 3 is advantageous because it offers more space in the cable duct 19 and thus more space for additional built-in components.

Figure 5:
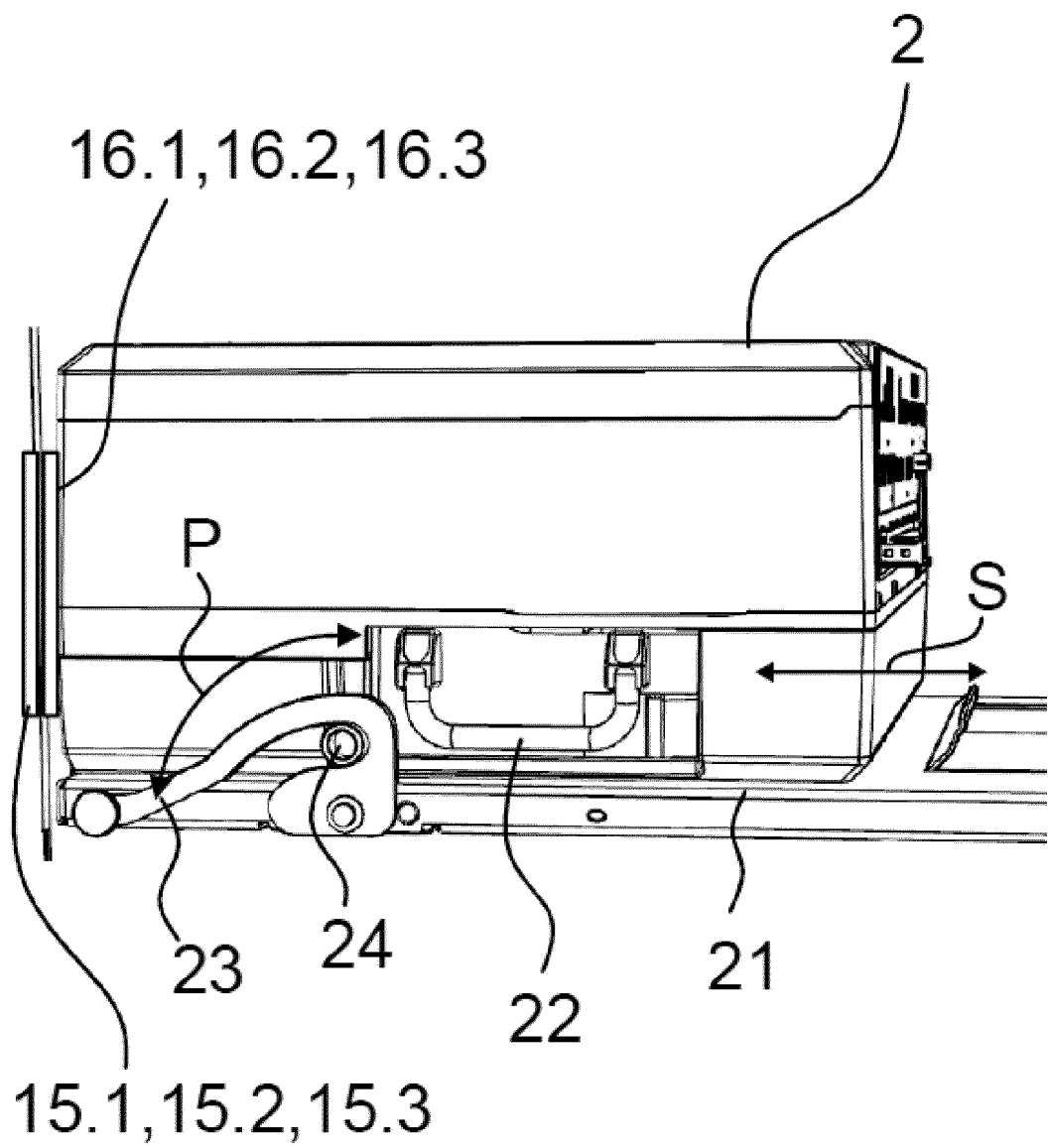
FIG. 5 is an enlarged perspective view of a single exemplary insertable control device in a drawer of the control cabinet.

As can be seen in particular in FIG. 5, each drawer 14.1, 14.2, 14.3 of the third cabinet compartment 4.3 can have sliding guides 21 that are designed to displaceably mount an insertable control device 2 inserted into the respective drawer 14.1, 14.2, 14.3 between a locked position (FIG. 5) in which the insertable control device 2 is connected mechanically, electrically and in terms of cooling air flow to the control cabinet 1, and an unlocked position in which the insertable control device 2 is disconnected mechanically, electrically and in terms of cooling air flow from the control cabinet 1 and can be pulled out of the control cabinet 1 manually. For manual pulling out, for example to the front, the insertable control device 2 can have a handle 22.

As shown in FIG. 5, each drawer 14.1, 14.2, 14.3 of the third cabinet compartment 4.3 can have a manually adjustable locking lever 23 that is designed to optionally move an insertable control device 2 mounted in the respective drawer 14.1, 14.2, 14.3 from the unlocked position to the locked position (FIG. 5) and/or from the locked position (FIG. 5) to the unlocked position, as indicated by the arrow directions of the arrow P.

The insertable control device 2 has a latching means 24 that is designed to transfer a movement of the locking lever 23 to a pushing movement S of the insertable control device 2 within the drawer 14.1, 14.2, 14.3 in cooperation with the locking lever 23 of the control cabinet 1 such that by moving the locking lever 23 over the latching means 24 of the insertable control device 2, the insertable control device 2 mounted in the respective drawer 14.1, 14.2, 14.3 can optionally be moved from the unlocked position into the locked position (FIG. 5) and/or from the locked position (FIG. 5) into the unlocked position.

By means of a bold dashed line L, FIGS. 2 and 4 each schematically show the boundary along which the third cabinet compartment 4.3 is sealed with respect to the first cabinet compartment 4.1 and the second cabinet compartment 4.2. In the case of the first embodiment, the heat sinks 26 of the respective insertable control device 2 are arranged between a control circuit board 27 and the power components of a frequency converter 28. An insertable control device 2 according to the first embodiment can accordingly be designed analogously to a control device as disclosed in WO 2018/138041 A1. In the case of the second embodiment, the control circuit board 27 and the power components of a frequency converter 28 are arranged on the same side, i.e., directly adjacent to one another, and the heat sinks 26 of the respective insertable control device 2 are arranged on the edge, i.e., next to the power components of a frequency converter 28 on a side opposite the control circuit board 27.

While the present invention has been illustrated by a description of various embodiments, and while these embodiments have been described in considerable detail, it is not intended to restrict or in any way limit the scope of the appended claims to such de-tail. The various features shown and described herein may be used alone or in any combination. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit and scope of the general inventive concept.

What is claimed is:

1. A control cabinet for at least one electrical drive controller, the control cabinet comprising:
   a control cabinet housing;
   a first cabinet compartment formed in the control cabinet housing and defining a fresh air duct in fluid communication between at least one inlet opening for fresh air and at least one first transfer opening;
   a second cabinet compartment formed in the control cabinet housing and defining an exhaust air duct in fluid communication between at least one second transfer opening and at least one outlet opening for exhaust air;
   a third cabinet compartment formed in the control cabinet housing and separated from the first cabinet compartment, the second cabinet compartment, and the environment outside the control cabinet; and
   a partition delimiting the third cabinet compartment in terms of flow from the first cabinet compartment and the second cabinet compartment, wherein the at least one first transfer opening and the at least one second transfer opening are formed in the partition;
   wherein the third cabinet compartment is in the form of a rack with at least one drawer, wherein each drawer is designed to receive an insertable control device.

2. The control cabinet of claim 1, wherein:
   in a surface region of the partition adjoining the first cabinet compartment, the partition comprises at least one separate first transfer opening for each corresponding drawer of the third cabinet compartment, each first transfer opening being positioned at a height of the corresponding drawer;
   each first transfer opening comprising a first sealing flange on a side of the transfer opening facing the respective drawer and designed to make airtight contact with a corresponding first sealing counter-flange of a suction opening on the corresponding insertable control device in an arrangement wherein the insertable control device is inserted and locked in the respective drawer.

3. The control cabinet of claim 2, wherein at least one of the first sealing flange or the first sealing counter-flange has a sealing lip.

4. The control cabinet of claim 1, wherein:
   in a surface region of the partition adjoining the second cabinet compartment, the partition comprises at least one separate second transfer opening for each corresponding drawer and positioned at a height of the corresponding drawer;
   each second transfer opening comprising a second sealing flange on a side of the transfer opening facing the respective drawer and designed to make airtight contact with a corresponding second sealing counter-flange of an exhaust opening on the corresponding insertable control device in an arrangement wherein the insertable control device is inserted and locked in the respective drawer.

5. The control cabinet of claim 4, wherein at least one of the second sealing flange or the second sealing counter-flange has a sealing lip.

6. The control cabinet of claim 1, further comprising at least one braking resistor arranged within the second cabinet compartment.

7. The control cabinet of claim 1, further comprising:
   a cable duct on a side of the partition opposite the third cabinet compartment, and positioned between the first cabinet compartment and the second cabinet compartment;
   wherein the partition has electrical connection means in a surface region of the cable duct;
   the electrical connection means arranged on a plug-in side of the partition facing in the direction of the third cabinet compartment such that corresponding electrical counterpart connection means of an insertable control device inserted and locked in the third cabinet compartment make contact with the electrical connection means.

8. The control cabinet of claim 1, wherein:
   each drawer of the third cabinet compartment comprises sliding guides designed to displaceably mount an insertable control device inserted into the respective drawer to and between:
     a locked position in which the insertable control device is connected mechanically, electrically, and in terms of cooling air flow to the control cabinet, and
     an unlocked position in which the insertable control device is disconnected mechanically, electrically, and in terms of cooling air flow from the control cabinet and can be manually pulled out of the control cabinet.

9. The control cabinet of claim 8, wherein each drawer of the third cabinet compartment comprises a manually adjustable locking lever designed to selectively move an insertable control device mounted in the respective drawer either from the unlocked position into the locked position and/or from the locked position into the unlocked position.

10. The control cabinet of claim 9, further comprising:
    an insertable control device designed to be inserted into a drawer of the third cabinet compartment;
    wherein the insertable control device is one of an electrical drive controller of a robot, an additional axis drive device, a refrigeration device, or a peripheral insertable frame for additional devices.

11. The control cabinet of claim 10, wherein:

the insertable control device comprises latching means cooperating with a corresponding locking lever of the control cabinet and designed to transfer a movement of the locking lever to a pushing movement of the insertable control device within the drawer;

such that movement of the locking lever over the latching means of the insertable control device mounted in the respective drawer moves the insertable control device from the unlocked position into the locked position and/or from the locked position into the unlocked position.

12. The control cabinet of claim 1, further comprising:

an insertable control device designed to be inserted into a drawer of the third cabinet compartment;

wherein the insertable control device is one of an electrical drive controller of a robot, an additional axis drive device, a refrigeration device, or a peripheral insertable frame for additional devices.

* * * * *